(12) United States Patent
Ballato et al.

(10) Patent No.: US 7,053,523 B1
(45) Date of Patent: May 30, 2006

(54) LATERAL FIELD EXCITATION OF BULK ACOUSTIC WAVES FROM AN IC-COMPLIANT LOW VOLTAGE SOURCE

(75) Inventors: Arthur Ballato, Oceanport, NJ (US); Richard H. Wittstruck, Howell, NJ (US); Xiaojun Tong, Wuxi (CN); Yicheng Lu, East Brunswick, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 124 days.

(21) Appl. No.: 10/774,645

(22) Filed: Feb. 2, 2004

(51) Int. Cl.
*H03H 9/145* (2006.01)
*H03H 9/25* (2006.01)

(52) U.S. Cl. ............................... 310/313 B; 310/313 R
(58) Field of Classification Search ................ 310/313, 310/365
See application file for complete search history.

(56) References Cited

U.S. PATENT DOCUMENTS

| | | | | |
|---|---|---|---|---|
| 4,350,916 | A * | 9/1982 | August et al. | 310/313 B |
| 5,889,446 | A * | 3/1999 | Yamada et al. | 333/193 |
| 6,465,930 | B1 * | 10/2002 | Wright | 310/313 B |
| 6,657,363 | B1 * | 12/2003 | Aigner | 310/324 |
| 2004/0201306 | A1 * | 10/2004 | Yamanouchi | 310/313 B |

FOREIGN PATENT DOCUMENTS

JP 09260993 A * 10/1997
JP 2005012736 A * 1/2005

\* cited by examiner

*Primary Examiner*—Darren Schuberg
*Assistant Examiner*—J. Aguirrechea
(74) *Attorney, Agent, or Firm*—Michael Zelenka; George B. Tereschuk

(57) ABSTRACT

An Interdigital Bulk Acoustic-Wave Transducer (IBAT) device is provided with pairs of exciting electrode fingers disposed sufficiently close together on the piezoelectric substrate and dielectric coating over the exciting electrode fingers to generate an IC-compatible voltage at relatively high electric field strength, resulting in a reduced region of excitation and uniform electric field strength distribution. The IBAT advantageously produces a lateral electric field substantially uniform over a substantial portion of the active BAW structure area, reducing, or virtually eliminating sharp voltage spikes, an electrical field produced by the low voltages resident on integrated circuit (IC) chips, usually of a magnitude of 10 volts, or lower, the planar electrode structure being compatible with IC processing techniques, such as photolithography and the BAWs produced thereby being essentially plane waves, with propagation away from, but with phase progression substantially parallel to, the substrate surface. Numerous IBAT structural arrangements are possible by advantageously over-coating the IBAT electrode finger stripes with an insulating dielectric in different configurations, and any possible configuration achieved through over-coating is considered to be within the contemplation of the devices and methods of the present invention. Interdigital bulk acoustic wave transducers and methods for exciting bulk acoustic waves with interdigital electrode fingers are also provided.

43 Claims, 10 Drawing Sheets

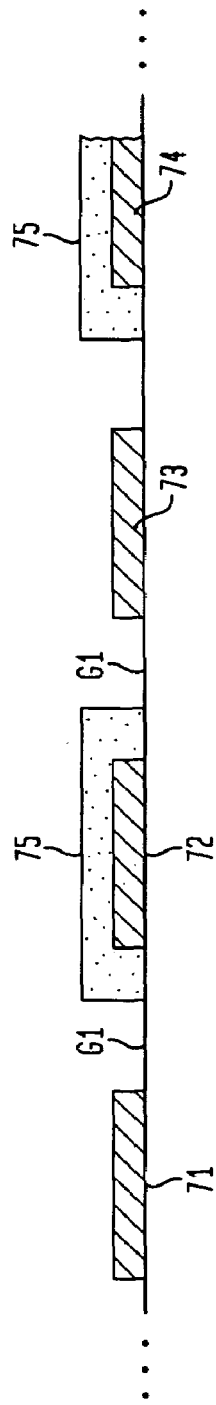
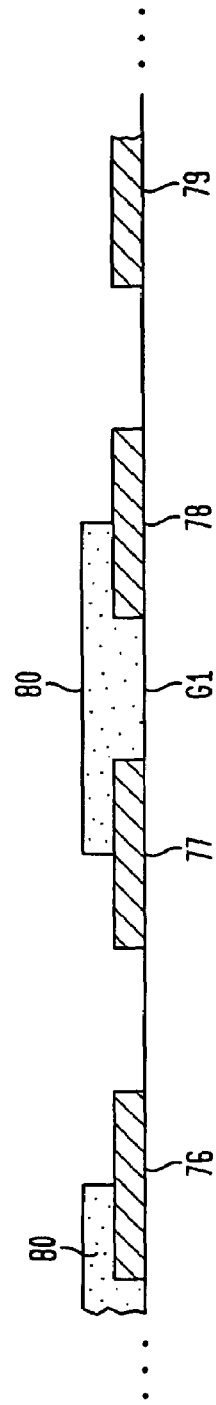
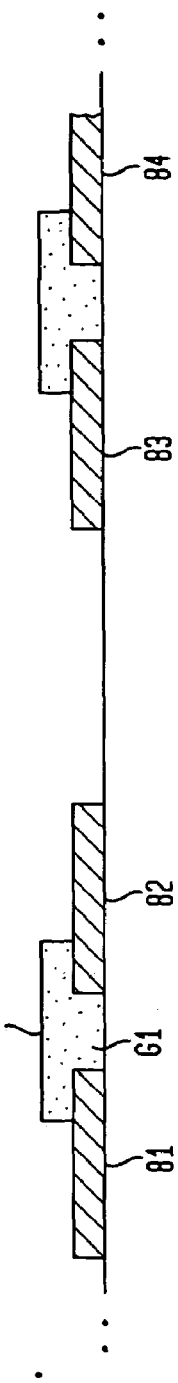
FIG. 8A
FIG. 8B
FIG. 8C

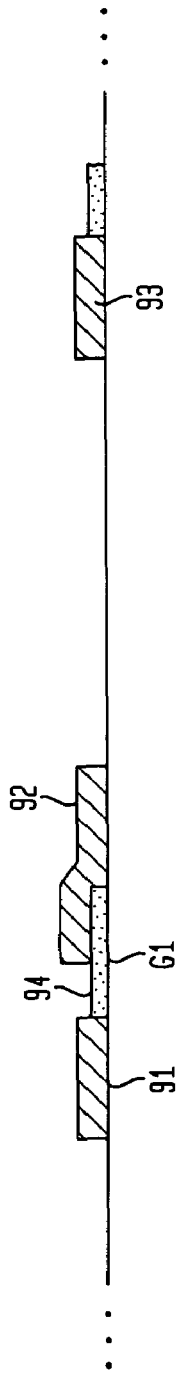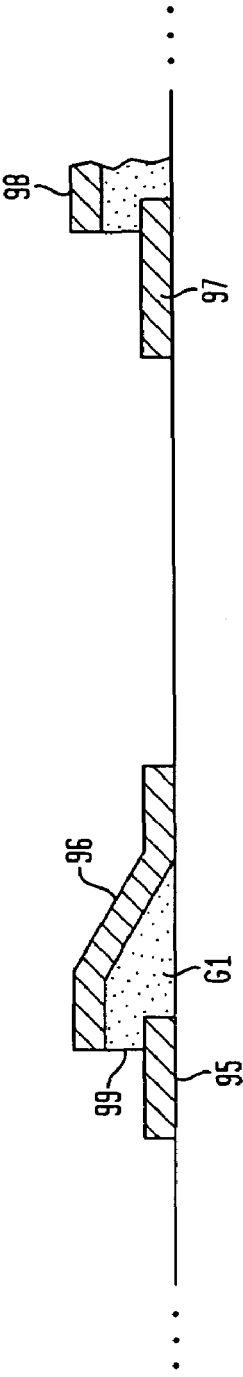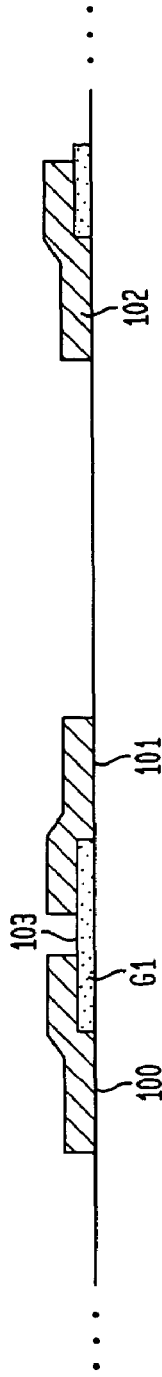

LATERAL FIELD EXCITATION OF BULK ACOUSTIC WAVES FROM AN IC-COMPLIANT LOW VOLTAGE SOURCE

GOVERNMENT INTEREST

The invention described herein may be manufactured, used, imported, sold, and licensed by or for the Government of the United States of America without the payment to us of any royalty thereon.

FIELD OF THE INVENTION

This invention relates in general to field of Bulk Acoustic Waves. In particular, this invention relates to an Interdigital Bulk Acoustic-Wave Transducer based on lateral field excitation of Bulk Acoustic Waves.

BACKGROUND OF THE INVENTION

Bulk Acoustic Waves (BAWs) are generated in piezoelectric media by applying a time-varying electric source to a suitable electrode system. The earliest uses of BAWs were in BAW plates, but they were found to be inadequate for higher frequencies because of difficulties in grinding the plates to the requisite thinness. Then, Surface Acoustic Waves (SAWs) were tried for the higher frequency ranges, but SAWs could not be generated efficiently, until the Interdigital Transducer (IDT) was introduced. The IDT had the estimable quality of generating SAWs by its geometry. The IDT finger spacing determined the main operating frequency of the SAW device, because it determined the wavelength, and hence frequency, at which resonance occurred. Because the IDT photolithography means, and because very small finger spacings could be obtained thereby, the IDT afforded the ability to reach high frequencies simply by depositing a metallic finger pattern on the surface of the thick, robust substrate. The surface wave "stuck" to the surface, and would not penetrate much into the depth of the substrate. There was no need to grind the substrate into an impossibly thin layer.

Yet, even SAWs suffer from a number of limitations such as beam divergence and triple-transit echoes and the possibility of making BAWs at frequencies to match, or even exceed, those of the SAWs has been investigated. Making BAWs to match the SAW frequencies would require techniques other than mechanical grinding, because the requisite thin dimensions were far too small to grind. Another approach was to fabricate a BAW with thin film. Up until now, IDTs have not been employed to generate BAWs in the thin film because the IDT is generally considered a modality for generating SAWs, not BAWs.

When BAWs are used as an acoustic resonator or filter, one or more of the frequency-determining dimensions of the piezoelectric body yield the desired resonance characteristics. Considering the case of a thin plate made of a single piezoelectric material with electrodes placed on the major surfaces, if the requisite piezoelectric coefficient exists when an electric voltage energizes the plate, it exhibits resonances when the exciting frequency is such that its thickness dimension is an odd integral multiple of one-half of an acoustic wavelength. In this situation, the BAW forms a standing wave pattern in the thickness direction and provides two counter-propagating waves that travel in the thickness direction. Communications technology continues to seek devices operating at increasingly higher frequencies. Wavelength is inversely proportional to frequency; therefore one finds increased use of the thickness of piezoelectric materials as the frequency-determining dimension for BAWs with thin film and membrane structures reaching the necessary higher frequencies. These mechanical motions are referred to as thickness modes of vibration. One excitation method is the "thickness excitation" (TE) or "thickness-field excitation" (TFE). When electrodes are placed at the plate edges and produce a field in a direction parallel to the plate surface, and hence perpendicular to the acoustic plane wave direction, this is known as "lateral excitation" (LE) or "lateral-field excitation" (LFE).

Besides exciting resonators with the SAW generated with an IDT, shallow bulk acoustic waves (SBAWs) or surface skimming bulk waves (SSBWs) have also been used. One characteristic of the SBAW and the SSBW is that surface perturbations, such as corrugations and ridges, placed parallel to the electrode fingers, but outside the IDT region, keep the quasi-BAW waves bound in the region of the surface so they do not escape into the substrate interior. However, devices based on the SBAW and SSBW wave types are not commercially viable. Until now, BAWs generated from IDT would be considered weak, spurious and detrimental because the typical low IC voltages do not provide adequate electric field strength for piezoelectric excitation of conventional electrode structures and result in unacceptable performance. Additionally, a non-uniform electric field further degrades performance. Up until now, the IDT has never been used purposely to generate planewave BAWs that propagate away from, and normal to, the substrate surface.

To overcome the disadvantages, shortcomings and limitations of the prior art resonating structures, there has been a long-felt need to provide a planar electrode structure that is both IC-compliant and able to be energized by a low-voltage source. It is also critical to achieve an adequate electric field strength that is uniformly distributed over the whole BAW accessible active region. The necessary increased voltage is generally inconsistent with the voltages resident on typical IC chips and in other electronic components. Electric field strength, which produces piezoelectric driving, equals, for a uniform field, applied voltage divided by the electrode separation. For a given applied voltage, requisite electric field strength determines the gap size, or separation. Prior art LFE electrode configurations employ individual electrode pairs placed on, or recessed in, a resonant substrate, causing a relatively large separation. The present inventors have developed a quite different technique for resolving the long-standing problems, difficulties and disadvantages of inadequate excitation strength and non-uniform power distribution.

The present invention provides an advantageous and innovative IDT structure to generate BAWs by modifying the IDT with dielectric structures to make the IDT capable of generating BAWs efficiently. Instead of depositing two electrodes exposing a large fraction of the active area of the resonant structure to the exciting electric field, this invention provides for depositing two exciting IDT electrode structures with finger spacings for LFE sufficiently close together on the piezoelectric substrate to cause a voltage compatible with IC devices for a usefully high electric field strength, which results in a substantial region of excitation covered by the IDT finger structure so as to produce efficient transduction. Depositing the exciting electrodes on the piezoelectric substrate in this manner results in an electrode system that is properly matched to the piezoelectric structure and overcomes the difficulties, disadvantages and shortcomings of the prior art piezoelectric resonators and frequency discriminators.

SUMMARY OF THE INVENTION

It is an object of the present invention to provide an Interdigital Bulk Acoustic-Wave Transducer ("IBAT") that provides relatively high electric field strength.

It is a further object of the present invention to provide an IBAT LFE structure that provides relatively high electric field strength by advantageously placing pairs of exciting electrodes sufficiently close together on the piezoelectric substrate to cause IC-compatible voltage with relatively high electric field strength, which results in a reduced region of excitation.

It is still another object of the present invention to provide a method for generating high electric field strength in an IBAT LFE structure by advantageously placing pairs of exciting electrodes sufficiently close together on the piezoelectric substrate to cause IC-compatible voltage with relatively high electric field strength, which results in a reduced region of excitation.

These and other objects and advantages can now be attained by this invention's Interdigital Bulk Acoustic-Wave Transducer (IBAT), comprising pairs of exciting electrode fingers disposed sufficiently close together on the piezoelectric substrate and dielectric coating over the exciting electrode fingers to generate an IC-compatible voltage at relatively high electric field strength, resulting in a reduced region of excitation and uniform electric field strength distribution. Those skilled in the art will readily recognize the advantages of producing a lateral electric field substantially uniform over a substantial portion of the active BAW structure area, reducing, or virtually eliminating sharp voltage spikes, an electrical field produced by the low voltages resident on integrated circuit (IC) chips, usually of a magnitude of 10 volts, or lower, the planar electrode structure being compatible with IC processing techniques, such as photolithography and the BAWs produced thereby being essentially plane waves, with propagation away from, but with phase progression substantially parallel to, the substrate surface. In accordance with the present invention, numerous IBAT structural arrangements are possible by advantageously over-coating the IBAT electrode finger stripes with an insulating dielectric in different configurations, and any possible configuration achieved through over-coating is considered to be within the contemplation of the devices and methods of the present invention. The devices and methods of the present invention include embodiments such as an interdigital bulk acoustic wave transducer device, interdigital bulk acoustic wave transducer and methods for exciting bulk acoustic waves with interdigital electrode fingers, to overcome the disadvantages, shortcomings and limitations of prior art devices and techniques.

BRIEF DESCRIPTION OF THE DRAWINGS

FIGS. 8A–8C are cross-sectional views of IDT electrode finger stripes over-coated with an insulating dielectric in accordance with the IBAT of the present invention;

FIGS. 9A–9C are cross-sectional views of IDT electrode finger stripes over-coated with an insulating dielectric in different configurations in accordance with the IBAT of the present invention.

DETAILED DESCRIPTION OF THE DRAWINGS

Figure 1A:
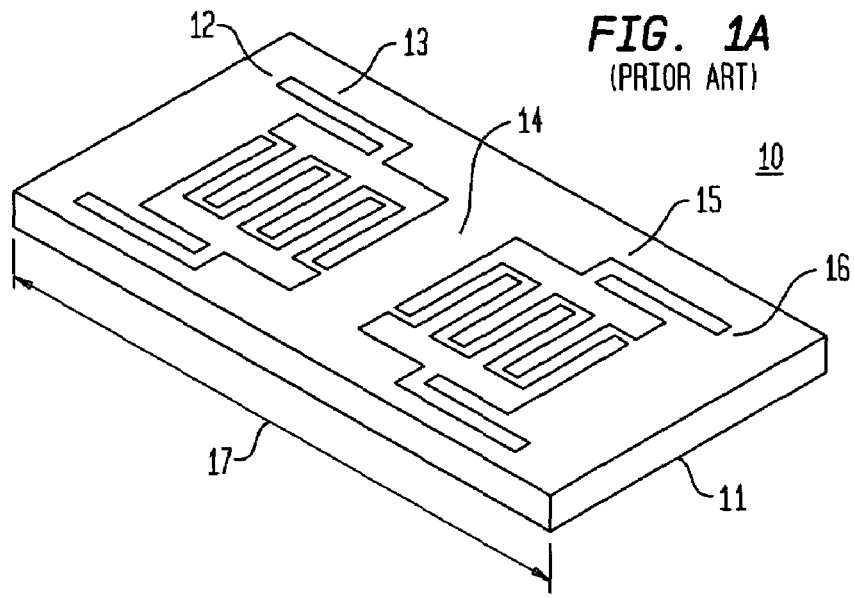
FIGS. 1A–1C are perspective, cross-sectional and exploded views of a prior art interdigital transducer.
Figure 1B:
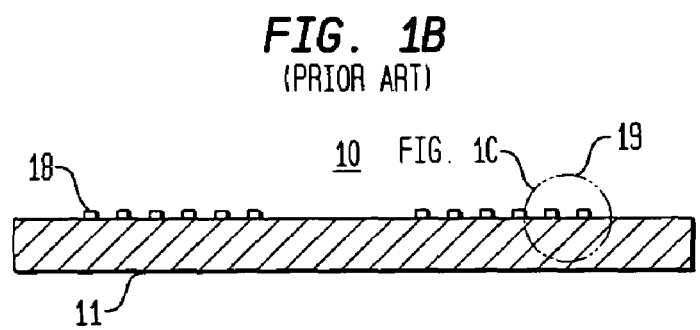
Figure 1C:
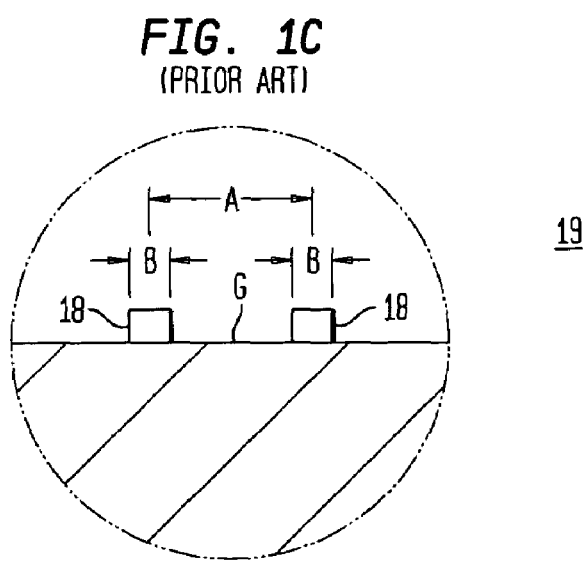

The simplest interdigital transducer (IDT) consists of two symmetrically interdigitated combs of identical electrode finger stripes, each comb consisting of geometrically parallel metallic fingers. Referring now to the drawings, FIGS. 1A–1C are perspective, cross-sectional and exploded views of an illustrative prior art interdigital transducer. FIG. 1A is a perspective view of an IDT piezoelectric plate 10, comprising a substrate 11, input terminal 12, input transducer 13, SAW 14, output transducer 15 and output terminal 16. Arrow 17 indicates the preferred direction of propagation in the piezoelectric plate. The FIG. 1B cross-sectional view of substrate 11 depicts two sets of three finger pairs of IDT electrode fingers stripes 18 for illustrative purposes. The typical IDT generally includes hundreds of finger pairs. The FIG. 1C exploded view depicts one pair, or period 19, of IDT finger stripes 18 and a period gap, or separation, G, between the IDT fingers 18. The FIG. 1C width A between the centers of each IDT finger 18 is ½ λ, and the width of each IDT finger 18 is ¼ λ. Aluminum is often preferred as the electrode finger material because its acoustic impedance closely matches the acoustic impedances of most piezoelectric substrates. All IDT finger stripes 18 of each comb are connected electrically in parallel via a bus bar electrode, which will be illustrated in more detail in subsequent drawings. The IDT piezoelectric plate 10 depicted in FIGS. 1A–1C is a one-port structure, and the exciting voltage is placed across the two bus bars to energize the electrode fingers.

Figure 2A:
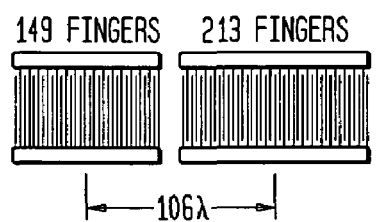
FIGS. 2A–2F are examples prior art IDT interdigital transducer configurations.
Figure 2B:
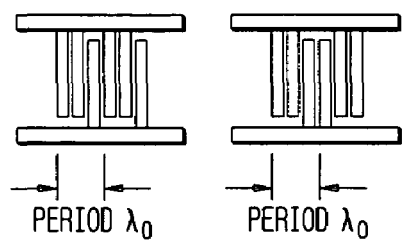
Figure 2C:
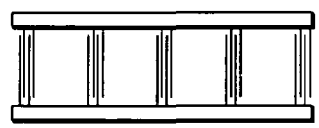
Figure 2D:
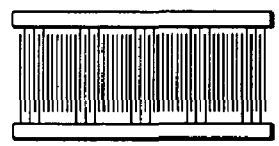
Figure 2E:
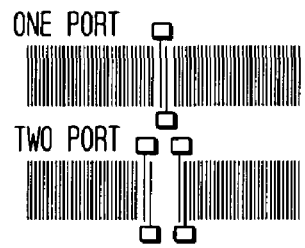
Figure 2F:
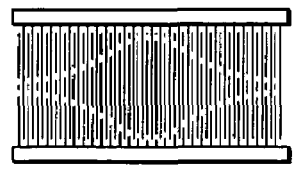

FIGS. 2A–2F depict a number of well-known IDT concepts and configurations. FIG. 2A illustrates that the number of electrode fingers and transducer separation is related to bandwidth. FIG. 2B illustrates that a given number of fingers per period, or wavelength. FIGS. 2C and 2D illustrate a thinned transducer, or open structure, and dummy fingers, respectively. FIG. 2E depicts one and two port configurations. FIG. 2F depicts the concept of apodization in which changing the overlap of the fingers from opposite electrodes in a determined pattern results in weighting the frequency response of the transducer.

Figure 3:
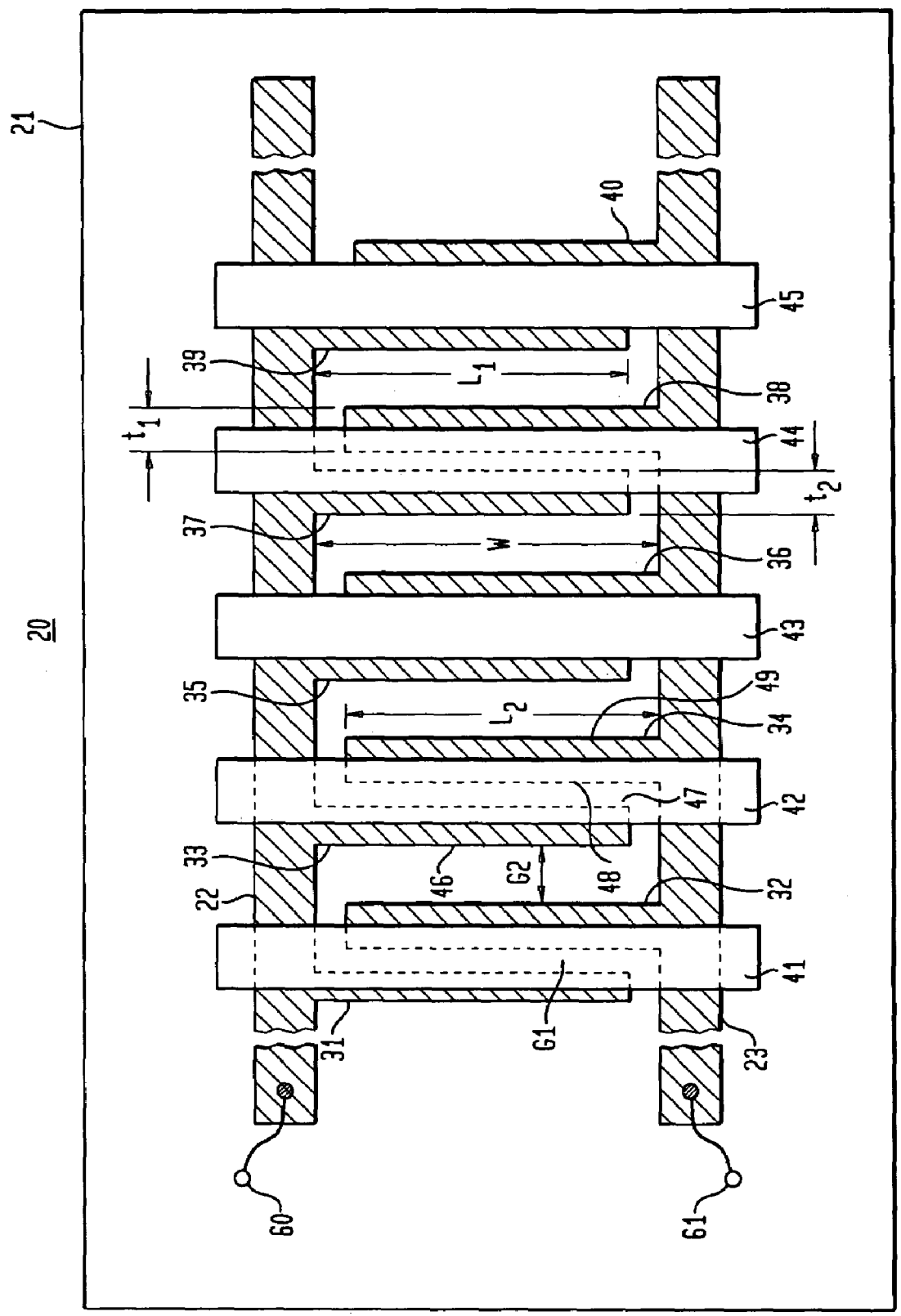
FIG. 3 is a top conceptual view of the interdigital bulk acoustic-wave transducer (IBAT) of the present invention.

Referring now to FIG. 3, there is depicted a top conceptual view of the Interdigital Bulk Acoustic Transducer (IBAT) 20 of the present invention. The IBAT 20 comprises a substrate 21, a first comb of IDT electrode finger stripes 31, 33, 35, 37 and 39 connected to a first bus bar 22 and a second comb of IDT electrode finger stripes 32, 34, 36, 38 and 40 connected to a second bus bar 23. Each set of paired IDT electrode fingers, e.g. 31 and 32, 33 and 34 and so on, are also known as a period, and are separated by a period gap G1, which has a first edge opposing any of the fingers 31, 33, 35, 37 and 39 of the first comb and a second edge opposing any of the fingers 32, 34, 36, 38 and 40 of the second comb. Each pair of IDT fingers constitutes a one-port structure. An electrode gap G2 separates the electrode edge of IDT finger 32 of the 31–32 period and the electrode edge of IDT finger 33 of the 33–34 period. One of the dielectric coating strips 41–45 cover each period gap G1, with the dielectric strips 41 and 42 depicted in cut-away style showing the underlying structures in a broken-line format. The electrode gap G2 is wider than the period gap G1. The exciting voltage is placed across the first and second bus bars 22 and 23, respectively, at contact points 60 and 61 to energize the IDT fingers 31–40 of the first and second combs.

The alternating fingers, such as 31 and 32, have opposite polarity because of the interdigitation. When placed on a piezoelectric substrate of appropriate orientation, the IDT pair 31–32 will, when supplied with an AC voltage, produce mechanical surface tractions that are piezoelectric in origin, and that are spatially distributed over the substrate 21 according to the placement of the first comb of IDT fingers 31, 33, 35, 37 and 39 and the second comb of IDT fingers 39 and 32, 34, 36, 38 and 40.

Those skilled in the art will readily recognize the mechanism of piezoelectric transduction, and that piezoelectric tractions are primarily produced at the electrode finger edges, where they can be approximated as Dirac delta functions. Consider conducting electrode finger stripes of width m, separated by gaps of width (1−m) and m is known as the metallization ratio. With the coordinate origin taken in the center of period gap G1, and potentials of ±½ volt applied to alternate electrodes, the expression for the tangential component of the electric field, which is the component parallel to the substrate surface, normalized to that of a parallel plate capacitor of the same electrode separation, is given as follows:

$$e(\psi,m) = (2\theta)/K(\sin^2\theta) \cdot \{\Sigma_n P_n(\cos(2\theta) \cdot \cos[(2n+1)\pi\psi]\}, \quad (1)$$

where $\psi$ is the normalized distance in the direction perpendicular to the electrode finger lengths, $P_n$ are the Legendre polynomials, K is the complete elliptic integral of the first kind, $\theta = [(1-m)\pi/2]$, and the summation is over n=0, 1, 2 .... The periodicity condition $$e(\psi+p,m) = (-1)^p e(\psi,m), \quad (2)$$

with p any integer, along with the symmetry condition $$e(-\psi,m) = +e(\psi,m), \quad (3)$$

describes $e(\psi, m)$ anywhere in terms of $\psi$ in the range ½ ≥ $\psi$ ≥ 0.

The IBAT 20 of the present invention is configured for plane-wave BAW excitation. Prior art IDTs produce electric fields that alternate in polarity from one electrode gap to the next, making the traditional IDT configuration unusable for lateral excitation (LE) BAW excitation, because the effect of the spatially alternating lateral fields produces a cancellation for purposes of BAW production. The spatial non-uniformity of the electric field, as discussed above, is an additional impediment to using prior art IDTs. The IBAT 20 of the present invention solves the problem of spatially alternating lateral fields and the advantageous structure of the first comb of IDT electrode fingers 31, 33, 35, 37 and 39, second comb of IDT electrode fingers 32, 34, 36, 38 and 40 and dielectric coating strips 41–45 efficiently generates both BAWs and suppresses the production of SAWs, or other mode types, to any significant extent. The IBAT devices and methods of the present invention have overcome and resolved two long-standing difficulties of prior art planar electrode structures for LFE excitation of BAW: the spatial asymmetry of electric field direction, i.e. alternating field directions over the active surface area with traditional IDT geometry; and non-uniform electric field strength in the gap regions, evidenced by having the electric field highly concentrated in the vicinity of the electrode finger edges. In accordance with the present invention, by employing suitably placed coatings of material with a high dielectric constant, along with multi-level electrode depositions, the long-standing difficulties, shortcomings and disadvantages of prior art BAW structures have in large measure be obviated.

Referring back to FIG. 3, dimension W is the total width separating the bus bars 22 and 23. The first comb of IDT electrode fingers 31, 33, 35, 37 and 39 have a length $L_1$ and finger width $t_1$. The second comb of IDT electrode fingers 32, 34, 36, 38 and 40 have a length $L_2$ and finger width $t_2$. Electrode overlap, or aperture, is $(L_1+L_2-W)$, which constitutes the width of the active region producing acoustic waves. A relatively small number of interdigital electrode fingers and related components are depicted in FIG. 3 for the sake of clarity, however the devices of the present invention would ordinarily include hundreds of the IDT electrode fingers.

The dielectric coating strips 41–45 are composed of an insulating material of high dielectric constant (high dielectric permittivity) and are placed over the narrower electrode gaps of width G1 while the G2 gaps remain uncoated. In this configuration, where gaps alternate between small (G1) and large (G2), and where the small gap regions are coated with a dielectric with a high permittivity, the high permittivity dielectric does not change the tangential component of electric field, E, i.e., that parallel to the surface, in the gap, but the normal component, which is perpendicular to the surface, is modified according to the well known relation:

$$E_{n1} = (\epsilon_2/\epsilon_1) E_{n2} \quad (4)$$

where subscript "1" refers to the dielectric, and subscript "2" refers to the substrate. If the permittivity of the coating is greater than that of the substrate, then the total field strength, which is the vector sum of both components, will be reduced in strength. The dielectric coating strips 41–45 should also reduce the danger of dielectric breakdown, or sparking, in the G1 period gap. In accordance with the present invention, the term "high dielectric constant" is considered to be a relative dielectric constant of about 10:100.

A number of variations are possible and are considered to be within the contemplation of this invention, such as having the first set of IDT electrode fingers 31, 33, 35, 37 and 39 and the second set of IDT electrode fingers 32, 34, 36, 38 and 40 composed of aluminum. Aluminum is often preferred as the electrode material because its acoustic impedance closely matches the acoustic impedances of most piezoelectric substrates. The dielectric coating strips 41–45 can be composed of vacuum deposited plastics. The dielectric coating strips 41–45 can completely cover each period gap G1, and the size of the period gap may be varied according to the required electrical field according to the formula G=V/E. This invention's IBAT can be used in numerous applications, including solid-state modulators, deflectors and delay lines.

Figure 4:
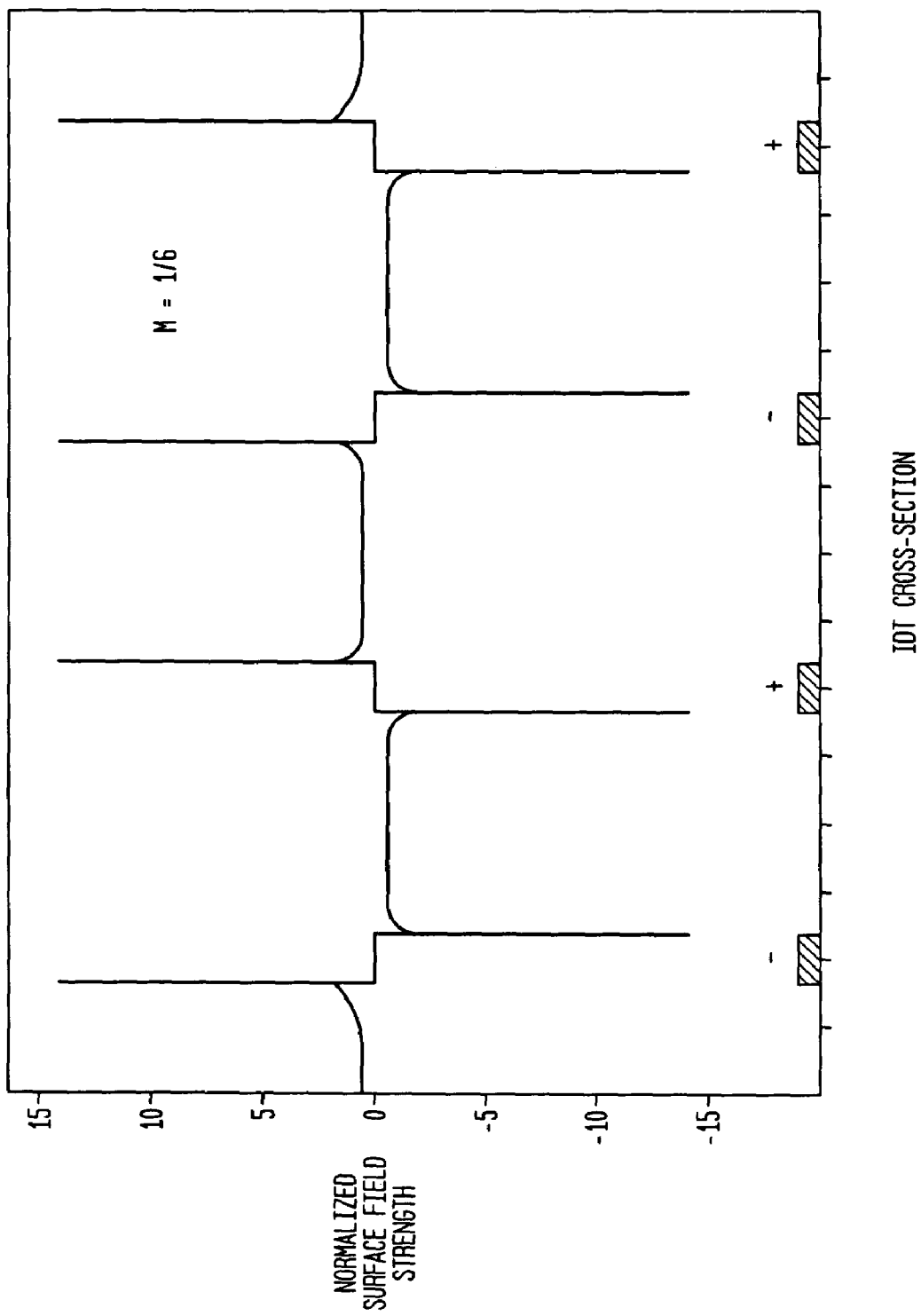
FIG. 4 is a graph plotting e along the gaps for a metallization ratio of m=⅙.
Figure 5:
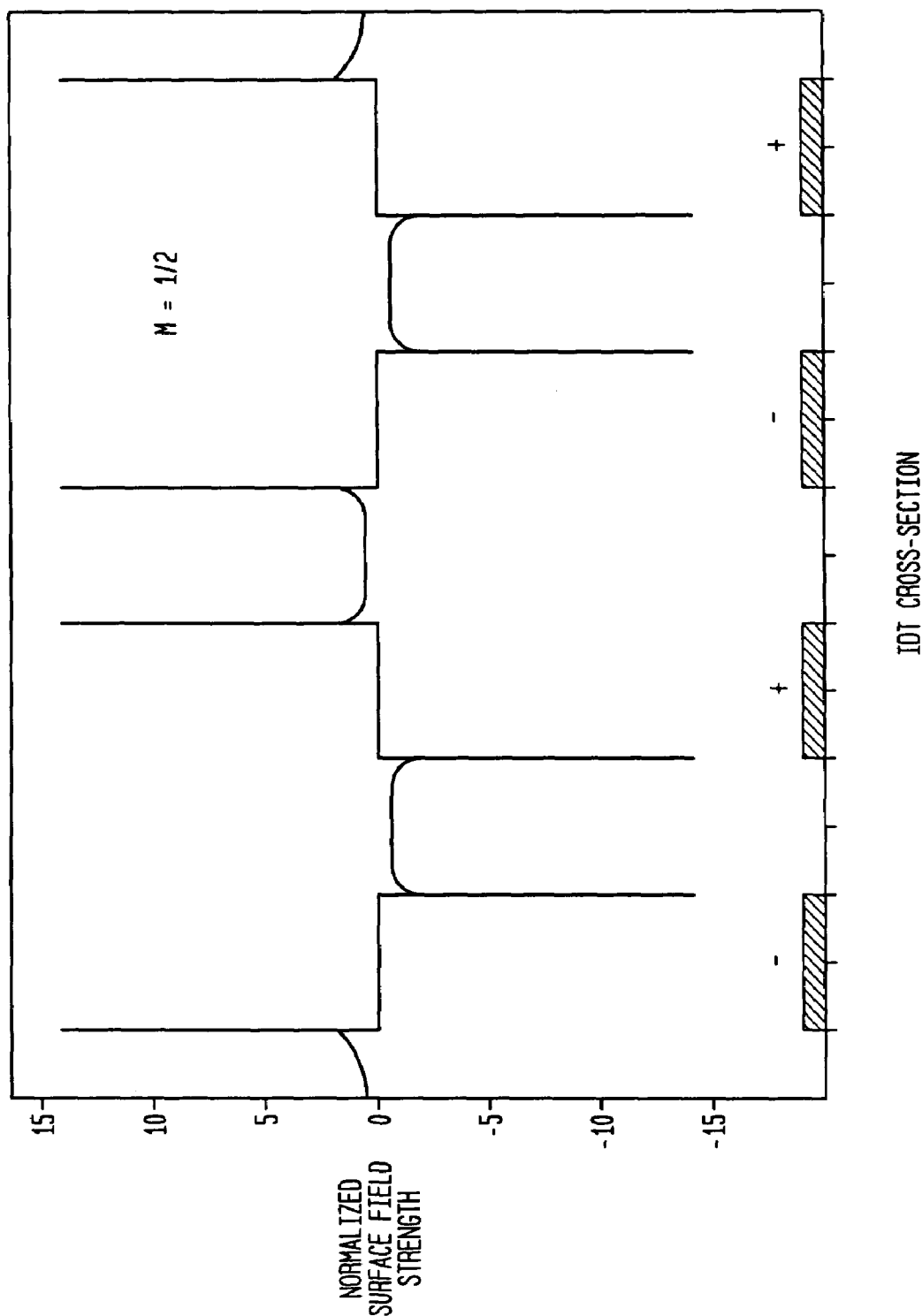
FIG. 5 is a graph plotting e along the gaps for a metallization ratio of m=½.
Figure 6:
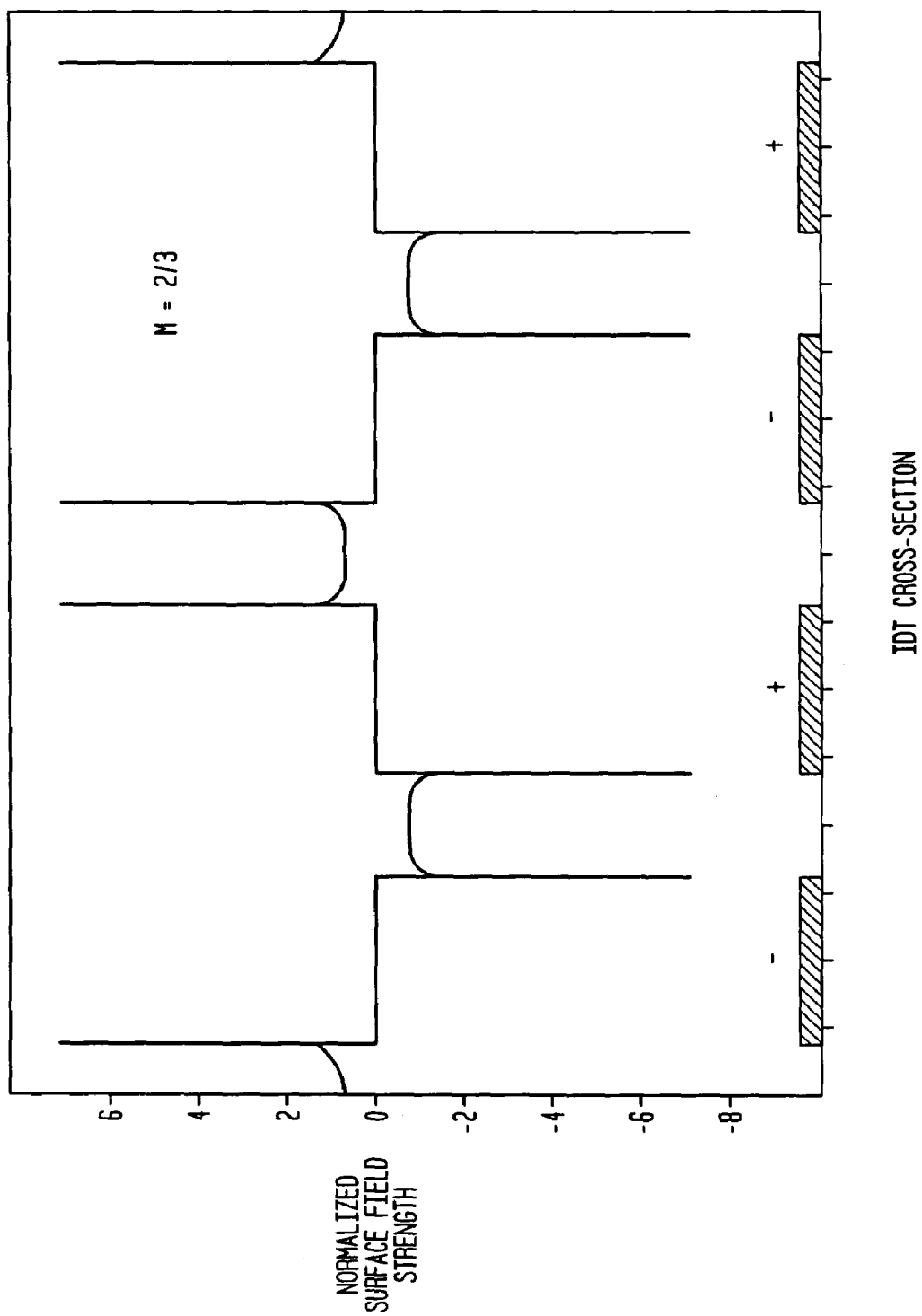
FIG. 6 is a graph plotting e along the gaps for a metallization ratio of m=⅔.

FIGS. 4–6 are charts that plot e ($\psi$, m) along the gaps for three values of metallization ratio: (a) m=⅙; (b) m=½; and (c) m=⅔. It is seen how the field strength peaks sharply in the vicinity of each electrode edge. These peaks, and the corresponding ones arising from the normal component of the electric field, lead to the interpretation of the piezoelectric tractions as Dirac delta functions placed at the electrode edges. Sharp spikes of electric field strength, as seen in FIG. 4, arise from the thin edges of the electrodes. Those skilled in the resonator arts will readily recognize that such high fields are a general phenomenon associated with metallic geometries having small curvatures, such as points, edges and other asperities.

Figure 7A:
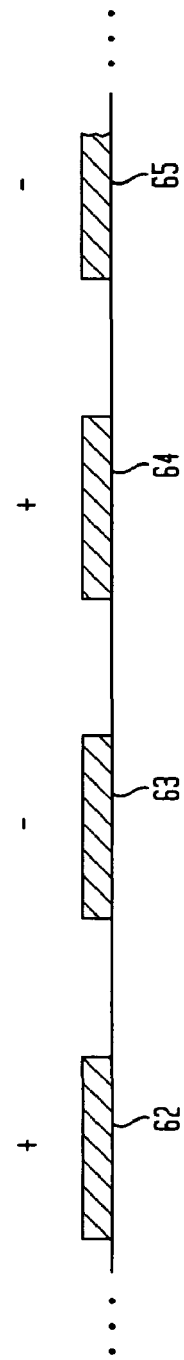
FIGS. 7A–7C are cross-sectional views of IDT electrode finger stripes deposited on a piezoelectric substrate with no dielectric coating.
Figure 7B:
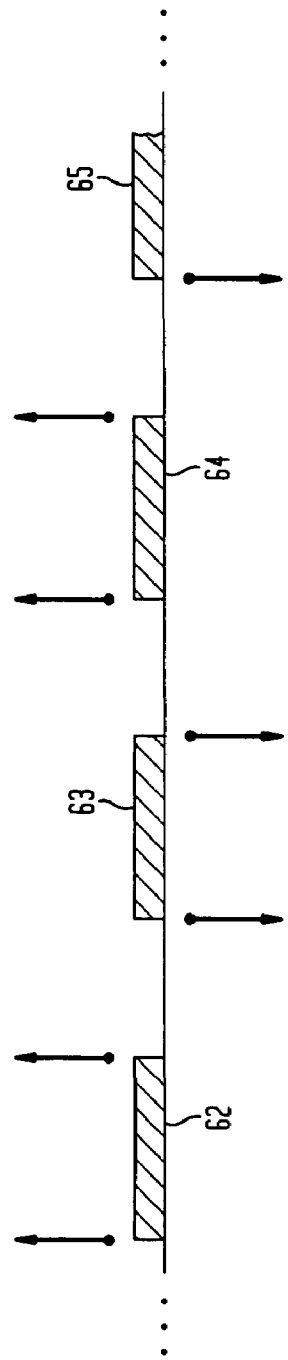
Figure 7C:
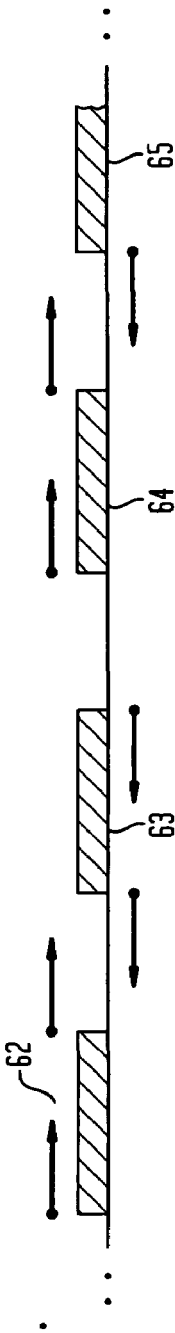

FIGS. 7A–7C are cross-sectional views of IDT fingers deposited on a piezoelectric substrate without any dielectric over-coating. The signs above the electrodes indicate the electric polarity at one instant of time. FIG. 7B illustrates the corresponding pattern of delta-functions of piezoelectric traction that appear along the electrode edges when the effective piezoelectric coefficient is such as to produce vertical forces. The other situation, where the forces are in the plane of the substrate, is shown in FIG. 7C.

Referring back to FIG. 3, electrode edges 46, 47, 48 and 49 are shown for illustrative purposes in conjunction with the period comprising IDT electrode fingers 33 and 34, and electrode edges 46 and 47 of first comb finger 33 have tractions pointing in the same direction; and electrode edges 48 and 49 of the second comb finger 34 have tractions pointing in the opposite direction. Metallic fingers constituting the IDT electrodes have thicknesses usually about 100 nanometers (1000 Å); thinner electrodes would produce unacceptably high electrical resistance and thicker ones would produce undesired mass loading effects. Electrodes of this thickness produce quite high electric field concentrations at their edges, as seen in FIG. 4. At times, the fields can be high enough to produce migration of the aluminum constituting the IDT electrode fingers, or even cause dielectric breakdown. Introduction of copper doping reduces the aluminum migration. A relatively small number of electrode edges are depicted in FIG. 3 for the sake of clarity, however the devices of the present invention would ordinarily include hundreds of IDT fingers with numerous electrode edges.

FIGS. 8A–8C are cross-sectional views of IDT electrode finger stripes over-coated with an insulating dielectric coating strip in a number of different configurations with a covered portion where the dielectric coating has been made. Referring now to FIG. 8A, IDT electrode fingers 71 and 72 form a period with IDT electrode finger 72 completely covered by dielectric coating strip 75 extending partially into a section of period gap G1 adjacent to IDT electrode finger 72. FIG. 8B depicts IDT electrode fingers 77 and 78 from a first and second comb forming a period and being partially covered by dielectric coating strip 80 that completely fills period gap G1. Referring now to FIG. 8C, there is depicted IDT electrode fingers 81 and 82 from a first and second comb in one period, each IDT finger is partially covered by dielectric coating strip 80 and the period gap G1 is completely covered, except that this configuration's period gap G1 is somewhat narrower than that depicted in FIG. 8B.

Placement of high permittivity dielectric coating strips as depicted in FIGS. 8A–8C helps reduce the effects of prior art IDT electric field reversals and to smooth out the electrode edge spikes illustrated in FIG. 4. Such coating strip arrangements are helpful in reducing the prior art's deleterious IDT effects, eliminating the long-standing problems associated with electric field reversals and electrode edge spikes requires the additional electrode configurations depicted in FIGS. 9A–9C and 10A–10C.

FIGS. 9A–9C are cross-sectional views of IDT electrode finger stripes coated with an insulating dielectric coating strip in still different configurations. Referring now to FIG. 9A, IDT first and second comb electrode fingers 91 and 92 form a period, with IDT second comb electrode finger 92 having a rectangular ledge. The period gap G1, having a second edge located underneath the rectangular ledge of second finger 92, is completely covered by the dielectric coating strip 94. FIG. 9B depicts IDT electrode fingers 95–98, dielectric coating strip 99 and IDT electrode fingers 95 and 96 forming a period. IDT second comb electrode finger 96, having an overhanging and sloping ledge, extends partially over IDT first comb electrode finger 95 and completely covers the period gap G1. The overhanging ledge slopes downward away from the IDT first comb electrode finger 95. In this case, the second comb IDT finger 96 is deposited on the piezoelectric substrate in such a fashion as to have a portion of its width on top of the dielectric coating strip 99 and the remaining portion of finger 96 on the piezoelectric substrate. FIG. 9C depicts IDT electrode fingers 100–102, dielectric coating strip 103 and IDT electrode fingers 100 and 101 forming a period. In this configuration, first comb IDT electrode finger 100 provides a rectangular ledge extending over the first edge of period gap G1, second comb IDT electrode finger 101 provides a rectangular ledge extending over the second edge of period gap G1 and the period gap G1 is completely filled with dielectric coating strip 103.

Figure 10A:
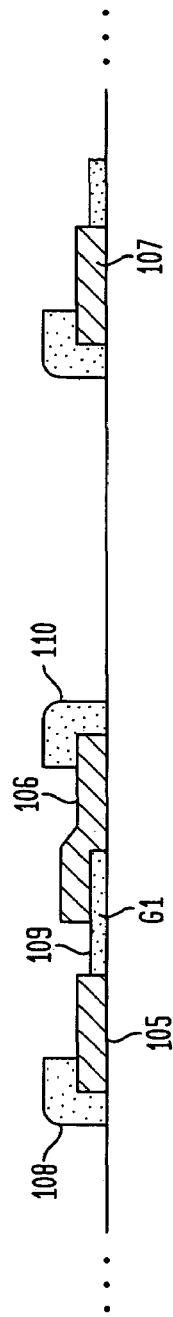
FIGS. 10A–10C are cross-sectional views of IDT electrode finger stripes over-coated with an insulating dielectric in additional configurations of the preferred embodiment in accordance with the IBAT of the present invention.
Figure 10B:
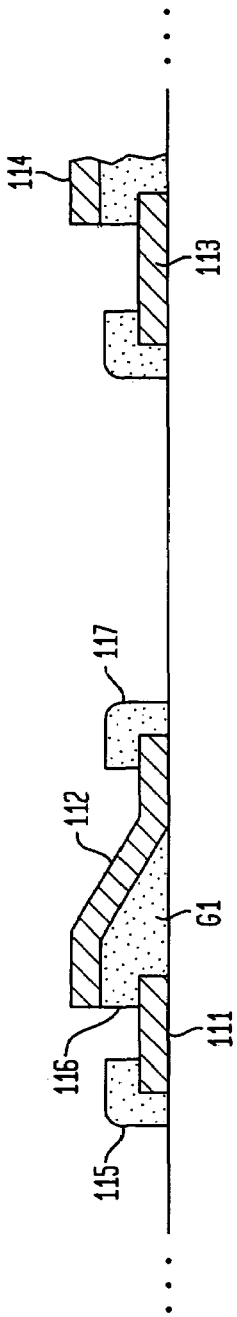
Figure 10C:
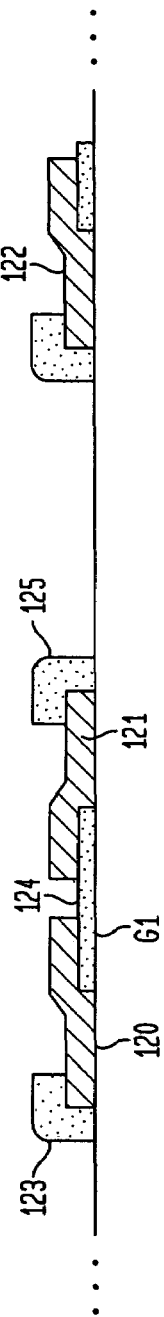

The various configurations depicted in FIGS. 9A–9C will each produce the desired IBAT LFE BAW excitation, however, the configurations depicted in FIGS. 10A–10C are considered to be the preferred embodiments because they combine the smoothing of dielectric edge coatings and the field deflection of the electrode overlap. The electrode overlap depicted in FIGS. 9 and 10 may be readily accomplished by the standard multilevel lithography and planarization techniques employed in microelectronics and nanoelectronics technology. This invention's IBAT can be used in numerous applications, including solid-state modulators, deflectors and delay lines.

FIGS. 10A–10C are cross-sectional views of IDT electrode finger stripes coated with multiple insulating dielectric coating strips and are considered to be the preferred embodiments of this invention's IBAT. In these three preferred FIGS. 10A–10C configurations, the first and second combs of IDT electrode fingers may be composed of aluminum. Aluminum is often preferred as the electrode material because its acoustic impedance closely matches the acoustic impedances of most piezoelectric substrates. The multiple dielectric coating strips depicted in FIGS. 10A–10C can be composed of vacuum deposited plastics. Referring now to FIG. 10A, IDT first comb electrode finger 105 and IDT second comb electrode finger 106 form a period, with IDT second comb electrode finger 106 having a rectangular ledge. A first dielectric coating strip 108 covers an electrode edge of the first comb IDT electrode finger 105 and a second dielectric coating strip 110 covers an electrode edge of the second comb IDT electrode finger 106. The period gap G1, having a second edge located underneath the rectangular ledge of second IDT comb electrode finger 106, is completely covered by a third dielectric coating strip 109. In this configuration, by covering the electrode edges of IDT fingers 105 and 106 with dielectric coating strips 108 and 110, respectively, the sharp spikes of electrode field intensity ordinarily found at electrode edges, and depicted in FIG. 4, are substantially reduced.

Referring now to FIG. 10B, IDT first comb electrode finger 111 and IDT second comb electrode finger 112 form a period, with IDT second comb electrode finger 112 having an overhanging and sloping ledge. A first dielectric coating strip 115 covers an electrode edge of the first comb IDT electrode finger 111 and a second dielectric coating strip 117 covers an electrode edge of the second comb IDT electrode finger 112. IDT second comb electrode finger 112, with its an overhanging and sloping ledge, extends partially over IDT first comb electrode finger 111 and completely covers the period gap G1, which has a second edge located underneath the overhanging ledge, and is completely covered by a third dielectric coating strip 116. The overhanging ledge slopes downward away from the IDT first comb electrode finger 111. In this case, the second comb IDT finger 112 is deposited on the piezoelectric substrate in such a fashion as to have a portion of its width on top of the dielectric coating strip 116 and the remaining portion of finger 112 on the piezoelectric substrate.

FIG. 10C depicts IDT first comb electrode fingers 120 and IDT second comb electrode finger 121 forming a period, with first comb IDT electrode finger 120 providing a rectangular ledge extending over the first edge of period gap G1, second comb IDT electrode finger 121 providing a rectangular ledge extending over the second edge of period gap G1. A first dielectric coating strip 123 covers an electrode edge of the first comb IDT electrode finger 120 and a second dielectric coating strip 125 covers an electrode edge of the second comb IDT electrode finger 121. Period gap G1, having a first edge located underneath the first comb electrode 120 and a second edge located underneath the second comb IDT electrode finger 121 is completely covered by a third dielectric coating strip 124.

The present invention also encompasses methods for exciting bulk acoustic waves. Referring back to FIG. 3, the methods of the present invention for exciting bulk acoustic waves with interdigital electrode fingers, comprise the steps of depositing a first comb of IDT electrode fingers on a surface of a piezoelectric substrate, depositing a second comb of IDT electrode fingers on the surface opposing, and interleaved with, the first comb, the piezoelectric substrate having a substrate acoustic impedance, connecting the first comb to a first bus bar, connecting the second comb to a second bus bar, the first and second bus bars being conductive and defining an active region on the surface, aligning a first one of the first comb and a second one of the second comb into a pair, positioning the first one and the second one parallel and proximate to one another and having an opposite polarity and an acoustic impedance matching the substrate acoustic impedance, the pair further comprising a period, the period having a period gap, G1, separating the first one and the second one, the period gap G1 having a first edge opposing the first one and a second edge opposing the second one, forming the period with a plurality of electrode edges separated by an electrode gap, G2, the electrode gap G2 being wider than, and parallel to, the period gap G1 and covering at least a portion of the period with a dielectric coating. The methods of the present invention also comprise the steps of placing an exciting AC voltage across the period to generate a plurality of alternating lateral electrical fields that alternate in polarity and a plurality of piezoelectric mechanical surface tractions produced at the electrode edges spatially distributed over the surface, providing the period with a given metallization ratio, forming a multitude of periods, generating a low-voltage, planar, lateral field excitation bulk acoustic wave propagating away from the surface that suppresses production of a surface acoustic wave from the alternating lateral electrical fields, the multiple periods and the dielectric coating and providing a lateral electric field with a constant magnitude substantially uniform over the active area, reducing a plurality of electrode field intensity spikes, with a phase progression substantially parallel to the surface from the bulk acoustic wave, and producing a plurality of spatially distributed lateral electric fields pointing substantially in a single direction over the active area.

Numerous configurations, variations, embodiments and uses of the devices and transducers of the present invention also apply equally to the methods of the present invention.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, geometrical arrangements and dimensions can achieve the results described herein, without departing from the spirit and scope of this invention. Accordingly, the present invention should not be limited by the foregoing description, but only by the appended claims.

What we claim is:

1. An interdigital lateral field excitation Bulk Acoustic Wave transducer device, comprising:
    a first comb of interdigital electrode fingers deposited on a surface of a piezoelectric substrate interleaves with an opposing second comb of interdigital electrode fingers deposited on said surface;
    said first comb being connected to a first bus bar and said second comb being connected to a second bus bar, said first and second bus bars being conductive and defining an active region on said surface, said piezoelectric substrate having a substrate acoustic impedance;
    a first electrode of said first comb and a second electrode of said second comb having an opposite polarity and an acoustic impedance matching said substrate acoustic impedance, being paired, positioned parallel and proximate to one another further comprising a period, said period having a period gap, G1, separating said first electrode from said second electrode, said period gap G1 having a first edge opposing said first electrode and a second edge opposing said second electrode;
    said period having a plurality of electrode edges separated by an electrode gap, G2, said electrode gap G2 being wider than, and parallel to, said period gap G1;
    a dielectric coating covers at least a portion of said period;
    an exciting AC voltage placed across said period generates a plurality of alternating lateral electrical fields that alternate in polarity and a plurality of piezoelectric mechanical surface tractions produced at said electrode edges being spatially distributed over said surface;
    said period having a given metallization ratio;
    said device having a multitude of periods;
    said alternating lateral electrical fields, said multiple periods, said dielectric coating and the positioning of said first electrode and said second electrode within each period generate a low-voltage, planar, lateral field excitation Bulk Acoustic Wave propagating away from said surface that suppresses production of a surface acoustic wave; and
    said Bulk Acoustic Wave provides a lateral electric field with a constant magnitude substantially uniform over said active area, reducing a plurality of electrode field intensity spikes, with a phase progression substantially parallel to said surface, producing a plurality of spatially distributed lateral electric fields pointing substantially in a single direction over said active area.

2. The interdigital lateral field excitation Bulk Acoustic Wave transducer device, as recited in claim 1, further comprising said first bus bar and said second bus bar being separated by a width, W.

3. The interdigital lateral field excitation Bulk Acoustic Wave transducer device, as recited in claim 2, further comprising each of said first comb having a first length, $L_1$, and a first finger width, $t_1$.

4. The interdigital lateral field excitation Bulk Acoustic Wave transducer device, as recited in claim 3, further comprising each of said second comb having a second length, $L_2$, and a second finger width $t_2$.

5. The interdigital lateral field excitation Bulk Acoustic Wave transducer device, as recited in claim 4, further comprising:
   said active region having an electrode overlap width measured according to the formula:

$$L_1 + L_2 - W;\text{ and}$$

an active region width that produces a plurality of acoustic waves.

6. The interdigital lateral field excitation Bulk Acoustic Wave transducer device, as recited in claim 5, further comprising a tangential component of an electric field, E, that is parallel to said surface within said period gap G1 and remains unaltered by a dielectric permittivity of said dielectric coating.

7. The interdigital lateral field excitation Bulk Acoustic Wave transducer device, as recited in claim 6, further comprising a normal component of said electric field, E, being perpendicular to said surface is modified according to the formula:

$$E_{n1} = (\epsilon_2/\epsilon_1)E_{n2}$$

where said $E_{n1}$ refers to said dielectric coating, and said $E_{n2}$ refers to said substrate.

8. The interdigital lateral field excitation Bulk Acoustic Wave transducer device, as recited in claim 7, further comprising:
   said dielectric coating is a dielectric coating strip;
   said electrode gap G2 remaining uncovered; and
   said portion being:
      all of said second electrode; and
      a section of the period gap G1 adjacent to said second electrode.

9. The interdigital lateral field excitation Bulk Acoustic Wave transducer device, as recited in claim 7, further comprising:
   said dielectric coating is a dielectric coating strip;
   said electrode gap G2 remaining uncovered; and
   said portion being:
      a section of said first electrode adjacent to said period gap G1;
      said period gap G1; and
      a section of said second electrode adjacent to said period gap G1.

10. The interdigital lateral field excitation Bulk Acoustic Wave transducer device, as recited in claim 7, further comprising:
    said dielectric coating is a dielectric coating strip;
    said electrode gap G2 remaining uncovered; and
    said portion being:
       a section of said first electrode adjacent to a narrowed period gap G1;
       said narrowed period gap G1; and
       a section of said second electrode adjacent to said narrowed period gap G1.

11. The interdigital lateral field excitation Bulk Acoustic Wave transducer device, as recited in claim 7, further comprising:
    said dielectric coating is a dielectric coating strip;
    said electrode gap G2 remaining uncovered;
    said second edge of the period gap G1 extends underneath a rectangular ledge of said second electrode; and
    said portion being said period gap G1.

12. The interdigital lateral field excitation Bulk Acoustic Wave transducer device, as recited in claim 7, further comprising:
    said dielectric coating is a dielectric coating strip;
    said electrode gap G2 remaining uncovered;
    said second electrode having an overhanging ledge extending over said first electrode and said period gap G1; and
    said portion being said period gap G1.

13. The interdigital lateral field excitation Bulk Acoustic Wave transducer device, as recited in claim 12, further comprising said overhanging ledge having a slope.

14. The interdigital lateral field excitation Bulk Acoustic Wave transducer device, as recited in claim 7, further comprising:
    said dielectric coating is a dielectric coating strip;
    said electrode gap G2 remaining uncovered;
    said first electrode having a first rectangular ledge extending over said first edge;
    said second electrode having a second rectangular ledge extending over said second edge; and
    said portion being said period gap G1.

15. The interdigital lateral field excitation Bulk Acoustic Wave transducer device, as recited in claim 7, further comprising:
    said conductive metal for the electrode fingers of said first and said second combs being aluminum;
    said dielectric coating being a plurality of dielectric coating strips;
    said electrode gap G2 remaining substantially uncovered;
    a first dielectric coating strip covers an electrode edge of said first electrode;
    said second electrode having a rectangular ledge extending over said second edge of the period gap G1;
    a second dielectric coating strip covers an electrode edge of said second electrode; and
    said portion being:
       said electrode edge of the first electrode;
       said electrode edge of the second electrode; and
       said period gap G1 covered by a third dielectric coating strip.

16. The interdigital lateral field excitation Bulk Acoustic Wave transducer device, as recited in claim 7, further comprising:
    said conductive metal for the electrode fingers of said first and said second combs being aluminum;
    said dielectric coating being a plurality of dielectric coating strips;
    said electrode gap G2 remaining substantially uncovered;
    a first dielectric coating strip covers an electrode edge of said first electrode;
    said second electrode having an overhanging ledge extending over said second edge of the period gap G1;
    a second dielectric coating strip covers an electrode edge of said second electrode; and said portion being:
  said electrode edge of the first electrode;
  said electrode edge of the second electrode; and
  said period gap G1 covered by a third dielectric coating strip.

17. The interdigital lateral field excitation Bulk Acoustic Wave transducer device, as recited in claim 16, further comprising said overhanging ledge having a slope.

18. The interdigital lateral field excitation Bulk Acoustic Wave transducer device, as recited in claim 7, further comprising:
  said first electrodes and said second electrodes being composed of aluminum;
  said dielectric coating being a plurality of dielectric coating strips;
  said electrode gap G2 remaining substantially uncovered;
  a first dielectric coating strip covers an electrode edge of said first electrode;
  said first electrode having a first rectangular ledge extending over said first edge;
  said second electrode having a second rectangular ledge extending over said second edge;
  a second dielectric coating strip covers an electrode edge of said second electrode; and
  said portion being:
    said electrode edge of the first electrode;
    said electrode edge of the second electrode; and
    said period gap G1 covered by a third dielectric coating strip.

19. An interdigital lateral field excitation Bulk Acoustic Wave transducer, comprising:
  a first comb of interdigital electrode fingers deposited on a surface of a piezoelectric substrate interleaves with an opposing second comb of interdigital electrode fingers deposited on said surface;
  said first comb being connected to a first bus bar and said second comb being connected to a second bus bar, said first and second bus bars being conductive and defining an active region on said surface, said piezoelectric substrate having a substrate acoustic impedance;
  a first electrode of said first comb and a second electrode of said second comb having an opposite polarity and an acoustic impedance matching said substrate acoustic impedance, being paired, positioned parallel and proximate to one another further comprising a period, said period having a period gap, G1, separating said first electrode from said second electrode, said period gap G1 having a first edge opposing said first electrode and a second edge opposing said second electrode;
  said period having a plurality of electrode edges separated by an electrode gap, G2, said electrode gap G2 being wider than, and parallel to, said period gap G1;
  a plurality of dielectric coating strips covers at least a portion of said period, said electrode gap G2 remaining substantially uncovered;
  an exciting AC voltage placed across said period generates a plurality of alternating lateral electrical fields that alternate in polarity and a plurality of piezoelectric mechanical surface tractions produced at said electrode edges being spatially distributed over said surface;
  said period having a given metallization ratio;
  a first dielectric coating strip covers an electrode edge of said first electrode;
  said second electrode having a second ledge extending over said second edge of said period gap G1;
  a second dielectric coating strip covers an electrode edge of said second electrode;
  said portion being:
    said electrode edge of the first electrode;
    said electrode edge of the second electrode; and
    said period gap G1 covered by a third dielectric coating strip;
  said transducer having a multitude of periods;
  said alternating lateral electrical fields, said multiple periods, said plurality of dielectric coating strips and positioning of said first electrode and said second electrode within each period generate a low-voltage, planar, lateral field excitation Bulk Acoustic Wave propagating away from said surface that suppresses production of a surface acoustic wave; and
  said Bulk Acoustic Wave provides a lateral electric field with a constant magnitude substantially uniform over said active area, reducing a plurality of electrode field intensity spikes, with a phase progression substantially parallel to said surface, producing a plurality of spatially distributed lateral electric fields pointing substantially in a single direction over said active area.

20. The interdigital lateral field excitation Bulk Acoustic Wave transducer, as recited in claim 19, further comprising said first comb being composed of aluminum.

21. The interdigital lateral field excitation Bulk Acoustic Wave transducer, as recited in claim 20, further comprising said second comb being composed of aluminum.

22. The interdigital lateral field excitation Bulk Acoustic Wave transducer, as recited in claim 21, further comprising:
  said first bus bar and said second bus bar being separated by a width, W;
  each of said first comb having a first length, $L_1$, and a first finger width, $t_1$; and
  each of said second comb having a second length, $L_2$, and a second finger width $t_2$.

23. The interdigital lateral field excitation Bulk Acoustic Wave transducer, as recited in claim 22, further comprising:
  said active region having an electrode overlap width measured according to the formula:

$L_1 + L_2 - W$; and an active region width that produces a plurality of acoustic waves.

24. The interdigital lateral field excitation Bulk Acoustic Wave transducer, as recited in claim 23, further comprising a tangential component of an electric field, E, that is parallel to said surface within said period gap G1 and remains unaltered by a dielectric permittivity of said dielectric coating.

25. The interdigital lateral field excitation Bulk Acoustic Wave transducer, as recited in claim 24, further comprising:
  a normal component of said electric field, E, being perpendicular to said surface is modified according to the formula:

$E_{n1} = (\epsilon_2 / \epsilon_1) E_{n2}$ where said $E_{n1}$ refers to said plurality of dielectric coating strips and said $E_{n2}$ refers to said substrate.

26. The interdigital lateral field excitation Bulk Acoustic Wave transducer, as recited in claim 25, further comprising said second ledge being rectangular.

27. The interdigital lateral field excitation Bulk Acoustic Wave transducer, as recited in claim 26, further comprising said first electrode having a first rectangular ledge extending over said first edge of the period gap G1.

28. The interdigital lateral field excitation Bulk Acoustic Wave transducer, as recited in claim 25, wherein said second ledge is an overhanging ledge sloping downward away from said first electrode.

29. A method for exciting lateral field excitation Bulk Acoustic Waves with interdigital electrode fingers, comprising the steps of:
   depositing a first comb of interdigital electrode fingers on a surface of a piezoelectric substrate;
   depositing a second comb of interdigital electrode fingers on said surface opposing, and interleaved with, said first comb, said piezoelectric substrate having a substrate acoustic impedance;
   connecting said first comb to a first bus bar;
   connecting said second comb to a second bus bar, said first and second bus bars being conductive and defining an active region on said surface;
   aligning a first electrode of said first comb and a second electrode of said second comb into a pair, said first electrode and said second electrode being positioned parallel and proximate to one another and having an opposite polarity and an acoustic impedance matching said substrate acoustic impedance, said pair further from said second electrode, said period gap G1 having a first edge opposing said first electrode and a second edge opposing said second electrode;
   forming said period with a plurality of electrode edges separated by an electrode gap, G2, said electrode gap G2 being wider than, and parallel to, said period gap G1;
   covering at least a portion of said period with a dielectric coating;
   placing an exciting AC voltage across said period to generate a plurality of alternating lateral electrical fields that alternate in polarity and a plurality of piezoelectric mechanical surface tractions produced at said electrode edges being spatially distributed over said surface;
   providing said period with a given metallization ratio;
   forming a multitude of periods;
   generating a low-voltage, planar, lateral field excitation Bulk Acoustic Wave propagating away from said surface that suppresses production of a surface acoustic wave from said alternating lateral electrical fields, said multiple periods, said dielectric coating and positioning said first electrode and said second electrode within each period; and
   providing a lateral electric field with a constant magnitude substantially uniform over said active area, reducing a plurality of electrode field intensity spikes, with a phase progression substantially parallel to said surface from said Bulk Acoustic Wave, and producing a plurality of spatially distributed lateral electric fields pointing substantially in a single direction over said active area.

30. The method for exciting lateral field excitation Bulk Acoustic Waves with interdigital electrode fingers, as recited in claim 29, wherein a tangential component of an electric field, E, that is parallel to said surface within said period gap G1 and remains unaltered by a dielectric permittivity of said dielectric coating.

31. The method for exciting lateral field excitation Bulk Acoustic Waves with interdigital electrode fingers, as recited in claim 30, wherein a normal component of said electric field, E, being perpendicular to said surface is modified according to the formula:

$$E_{n1} = (\epsilon_2/\epsilon_1) E_{n2}$$

where said $E_{n1}$ refers to said dielectric coating, and said $E_{n2}$ refers to said substrate.

32. The method for exciting lateral field excitation Bulk Acoustic Waves with interdigital electrode fingers, as recited in claim 31, further comprising the step of forming said dielectric coating with a plurality of dielectric coating strips.

33. The method for exciting lateral field excitation Bulk Acoustic Waves with interdigital electrode fingers, as recited in claim 32, further comprising the steps of:
   forming said dielectric coating with a dielectric coating strip;
   permitting said electrode gap G2 to remain uncovered; and
   providing said portion over:
      all of said second electrode; and
      a section of the period gap G1 adjacent to said second electrode.

34. The method for exciting lateral field excitation Bulk Acoustic Waves with interdigital electrode fingers, as recited in claim 32, further comprising the steps of:
   forming said dielectric coating with a dielectric coating strip;
   permitting said electrode gap G2 to remain uncovered; and
   forming said portion over:
      a section of said first electrode adjacent to said period gap G1;
      said period gap G1; and
      a section of said second electrode adjacent to said period gap G1.

35. The method for exciting lateral field excitation Bulk Acoustic Waves with interdigital electrode fingers, as recited in claim 32, further comprising the steps of:
   forming said dielectric coating with a dielectric coating strip;
   permitting said electrode gap G2 to remain uncovered; and
   forming said portion over:
      a section of said first electrode adjacent to a narrowed period gap G1;
      said narrowed period gap G1; and
      a section of said second electrode adjacent to said narrowed period gap G1.

36. The method for exciting lateral field excitation Bulk Acoustic Waves with interdigital electrode fingers, as recited in claim 32, further comprising the steps of:
   forming said dielectric coating with a dielectric coating strip;
   permitting said electrode gap G2 to remain uncovered; and
   configuring said second edge of the period gap G1 to extend underneath a rectangular ledge of said second electrode; and
   forming said portion over said period gap G1.

37. The method for exciting lateral field excitation Bulk Acoustic Waves with interdigital electrode fingers, as recited in claim 32, further comprising the steps of:
   forming said dielectric coating with a dielectric coating strip;
   permitting said electrode gap G2 to remain uncovered;
   configuring said second electrode with an overhanging ledge extending over said first electrode and said period gap G1; and
   forming said portion over said period gap G1.

38. The method for exciting lateral field excitation Bulk Acoustic Waves with interdigital electrode fingers, as recited in claim 37, further comprising the step of forming said overhanging ledge with a slope.

39. The method for exciting lateral field excitation Bulk Acoustic Waves with interdigital electrode fingers, as recited in claim 32, further comprising the steps of:
  forming said dielectric coating with a dielectric coating strip;
  permitting said electrode gap G2 to remain uncovered;
  configuring said first electrode with a first rectangular ledge extending over said first edge;
  configuring said second electrode with a second rectangular ledge extending over said second edge; and
  forming said portion over said period gap G1.

40. The method for exciting lateral field excitation Bulk Acoustic Waves with interdigital electrode fingers, as recited in claim 32, further comprising the steps of:
  selecting aluminum as said conductive metal;
  forming said dielectric coating with a plurality of dielectric coating strips;
  permitting said electrode gap G2 to remain substantially uncovered;
  locating a first dielectric coating strip over an electrode edge of said first electrode;
  configuring said second electrode with a rectangular ledge extending over said second edge of the period gap G1;
  locating a second dielectric coating strip over an electrode edge of said second electrode; and
  forming said portion from:
    said electrode edge of the first electrode;
    said electrode edge of the second electrode; and
    covering said period gap G1 with a third dielectric coating strip.

41. The method for exciting lateral field excitation Bulk Acoustic Waves with interdigital electrode fingers, as recited in claim 32, further comprising the steps of:
  selecting aluminum as said conductive metal;
  forming said dielectric coating with a plurality of dielectric coating strips;
  permitting said electrode gap G2 to remain substantially uncovered;
  locating a first dielectric coating strip over an electrode edge of said first electrode;
  configuring said second electrode with an overhanging ledge extending over said second edge of the period gap G1;
  locating a second dielectric coating strip over an electrode edge of said second electrode; and
  forming said portion from:
    said electrode edge of the first electrode;
    said electrode edge of the second electrode; and
    covering said period gap G1 with a third dielectric coating strip.

42. The method for exciting lateral field excitation Bulk Acoustic Waves with interdigital electrode fingers, as recited in claim 41, further comprising the step of forming said overhanging ledge with a slope.

43. The method for exciting lateral field excitation Bulk Acoustic Waves with interdigital electrode fingers, as recited in claim 32, further comprising the steps of:
  selecting aluminum as said conductive metal;
  forming said dielectric coating with a plurality of dielectric coating strips;
  permitting said electrode gap G2 to remain substantially uncovered;
  locating a first dielectric coating strip over an electrode edge of said first electrode;
  configuring said first electrode with a first rectangular ledge extending over said first edge of the period gap G1;
  configuring said second electrode with a second rectangular ledge extending over said second edge of the period gap G1;
  locating a second dielectric coating strip over an electrode edge of said second electrode; and
  forming said portion from:
    said electrode edge of the first electrode;
    said electrode edge of the second electrode; and
    covering said period gap G1 with a third dielectric coating strip.

* * * * *